United States Patent [19]

Wunner et al.

[11] Patent Number: 5,095,280

[45] Date of Patent: Mar. 10, 1992

[54] DUAL DOT CLOCK SIGNAL GENERATOR

[75] Inventors: John J. Wunner, Warrington; Joseph T. Gallagher, Jr., Hatboro, both of Pa.

[73] Assignee: Integrated Circuit Systems, Inc., Valley Forge, Pa.

[21] Appl. No.: 621,249

[22] Filed: Nov. 26, 1990

[51] Int. Cl.⁵ .............................................. H02J 1/00
[52] U.S. Cl. ..................................... 328/63; 328/104
[58] Field of Search .................. 328/63, 72, 104, 137; 307/269

[56] References Cited

U.S. PATENT DOCUMENTS

| | | | |
|---|---|---|---|
| 4,388,597 | 6/1983 | Blakley et al. | 331/12 |
| 4,423,383 | 12/1983 | Svendsen | 328/63 |
| 4,451,930 | 5/1984 | Chapman et al. | 455/260 |
| 4,495,468 | 1/1985 | Richards | 328/63 |
| 4,512,035 | 4/1985 | Victor | 455/165 |
| 4,545,072 | 10/1985 | Skutta et al. | 455/183 |
| 4,686,482 | 8/1987 | Zoetman | 328/63 |
| 4,819,081 | 4/1989 | Volk | 328/133 |
| 4,870,366 | 9/1989 | Pelletier | 328/140 |
| 4,949,052 | 8/1990 | Chigira | 328/104 |
| 4,953,163 | 8/1990 | Miyamoto | 328/63 |
| 4,988,901 | 1/1991 | Kamuro | 328/104 |

OTHER PUBLICATIONS

WD90C60, Video Graphic & Array Clock, Western Digital Imaging.

AV9114, Dual Video Frequency Generator, Avesem Corp.

ICS1495 Video Dot Clock Generator, Integrated Circuit Systems, Inc.

Primary Examiner—Eugene R. LaRoche
Assistant Examiner—A. Zarabian
Attorney, Agent, or Firm—Ratner & Prestia

[57] ABSTRACT

A dual dot clock signal generator consisting of two similar programmable phase locked loops simultaneously generates a video clock signal and a memory clock signal. Both the video clock signal and the memory clock signal may have one of several different frequencies. The generator includes circuitry which detects when one of the selected frequencies is identical to or a submultiple of the other. The comparison circuitry which detects this condition acts to change the frequency of one of the clock signals, and supplies the other clock signal in its place. Both the video clock signal generator and the memory clock signal generator are programmable via their respective internal memories, and the internal memory of the video clock signal generator carries additional information which identifies those video frequencies which are identical to or a submultiple of the frequencies available from the memory phase locked loop. By substituting the memory clock signal or a divided version of the memory clock signal for the conflicting video clock signal and changing the frequency of the VCO within the video phase locked loop, the problem of cross-interference between the two clock signals is eliminated.

9 Claims, 5 Drawing Sheets

DUAL DOT CLOCK SIGNAL GENERATOR

FIELD OF THE INVENTION

The present invention relates to clock signal generation circuitry for use with high performance video graphics processors and particularly to an integrated circuit incorporating two programmable clock signal generators which provide clock signals over a relatively wide range of frequencies.

BACKGROUND OF THE INVENTION

Modern data processing equipment utilize video display devices which provide a wide range of picture element (pixel) resolutions. For example, a computer graphics adapter (CGA) video interface card for an IBM-compatible personal computer provides a video image having 64,000 (320×200) pixel or dot positions in each displayed image, while a high-resolution 1 k variable graphics adapter (VGA) video interface card provides 786,432 (1024×768) pixel positions. Each of these video images is displayed in about the same amount of time, consequently, the frequency of the clock signal used to display the 1 k VGA image is approximately twelve times that of the signal used to display the CGA image. In addition, there are other computer graphic interfaces which provide even greater resolution and thus, employ even higher-frequency dot clock signals.

In some computer graphics applications, it may be desirable to provide several levels of resolution. For example, a relatively low resolution display format may be preferred for preparing text or for determining image layout, since the smaller number of pixels in the image may translate to less elapsed time to generate or change the image. However, a relatively high-resolution display format may be preferred for applications such as desktop publishing in which high-quality text may be combined with high-resolution graphic images.

A high performance VGA interface card, such as the VGA Wonder$^{tm}$ available from ATI Technologies Inc., is compatible with several video graphic display formats including CGA, EGA (640×350), VGA (640×480), Super VGA (800×600) and 1 k VGA. In addition, the interface card supports text display formats having fewer pixels per screen image than even CGA. A flexible video interface of this type may use several different pixel clock signals having frequencies that range from approximately 100 MHz for the 1 k VGA format to approximately 20 MHz for the CGA and text display formats.

In addition to the high speed pixel clock signals supported by the video graphic interface cards, there is also a requirement for other high speed clock signals to perform functions such as parallel loading the video shift register and memory refresh on the video RAMs or DRAMs. Thus it would be advantageous for a clock signal generator to be capable of producing two separate, programmable frequency clock signals. It would be a further advantage if the two clock signals could be generated on a single integrated circuit (IC) using a single reference crystal oscillator or other reference source.

Many of the currently available video display interface cards employ several clock oscillators to produce these different clock signal frequencies. This duplication of circuitry increases the complexity and cost of the video display card over that of a multi-frequency card which employs a single oscillator having a single resonant crystal.

One integrated circuit which generates clock signals uses a single reference to produce two independent clock signals is the WD90C60, available from Western Digital Imaging. From a 14 MHz source, a video clock signal (VCLK) and memory clock signal (MCLK) are produced. The VCLK signal may have a frequency of either 25 MHz or 28 MHz. This frequency is dynamically alterable under firmware control. The MCLK signal is jumper selectable between 36 MHz (for 120 ns DRAMs) and 42 MHz (for 100 ns DRAMs). In addition to these two internally generated clock signals, up to three external clock signals may be multiplexed with the internally generated video clock signal, and may be selected as the video clock signal by setting a mode control register. Also in the same product family is the WD90C61, which provides one of eight clock signal frequencies for the VCLK output signal, and one of four clock signal frequencies for the MCLK output signal.

Another dual clock signal generator IC currently available is Avasem Corporation's AV9114 Dual Video Frequency Generator. This integrated circuit provides a first internally generated clock signal, which may range in frequency from 14 MHz to 40 MHz, at its CLK0 output terminal, and a second clock signal, CLK1, which may range in frequency from 16 MHz to 50 MHz. As with the WD90C60, the capability exists for one of three external clock signals to be selected as the output signal CLK0 in place of the internally generated signal. However, neither of these two integrated circuits is capable of generating the high frequencies demanded by the high resolution video graphics interfaces such as the 1 k VGA standard discussed above.

A problem is known to exist when phase-locked loops (PLLs) are used to generate two independent clock signal frequencies on the same integrated circuit. When the signals generated by the video controller chip happen to be close to one another in frequency or phase, users have observed a severe degradation in both clock signals due to cross-signal interference. This interference occurs because the voltage controlled oscillator (VCO) within each PLL tries to lock to the frequency produced by the other oscillator. This causes the VCOs to drift, rendering the generated clock signals unusable for their intended application. To avoid this problem, users of currently available circuits which generate two clock signals must ensure that two conflicting frequencies are never selected for the signals. This limits the flexibility of the systems designed with these circuits.

SUMMARY OF THE INVENTION

The present invention is embodied in a dual dot clock signal generator, realized as an integrated circuit, which uses a single reference oscillatory signal and is programmable for generating two independent clock signals at several different frequencies. The dual dot clock signal generator includes a PLL in each of its two clock signal generator circuits. Each PLL includes a voltage controlled oscillator, phase comparator, and programmable frequency divider. Each frequency divider includes a separately programmable binary counter. In addition to the phase-locked loop, each clock signal generator includes a memory for storing frequency information for the counters and VCO's.

In another aspect of the invention, the video clock output signal VCLK is multiplexed with two externally generated clock signals, as well as with the input reference signal, to provide signals having frequencies outside the range of the two internal clock signal generators.

In another aspect of the invention, each selected frequency code stored within the video ROM is tagged with three bits that identify those video frequencies which are nominally identical to or close to the frequencies represented by codes residing in the memory ROM. When a video clock signal frequency is selected which is nominally identical to or close to the selected memory frequency, a shutdown comparator circuit uses the tag bits to detect the conflicting selection and acts to change the VCO frequency of the video clock signal generator. The shutdown comparator also causes the video clock signal to be replaced by the memory clock signal. This has the effect of causing the dual clock generator to behave like a single clock signal generator having two output terminals.

In yet another aspect of the invention, a provision is made to identify selected video frequencies which are harmonically related to the selected memory frequencies. When for example, the selected video clock signal frequency is approximately one-half the frequency of the memory clock signal, control circuitry within the shutdown comparator acts to change the frequency of the video clock signal to avoid interference. In this instance, the shutdown comparator also acts to replace the video clock output signal with a divided version of the memory clock output signal.

DETAILED DESCRIPTION

The following is a description of an exemplary dual dot clock signal generator in accordance with the present invention.

Overview

Figure 1:
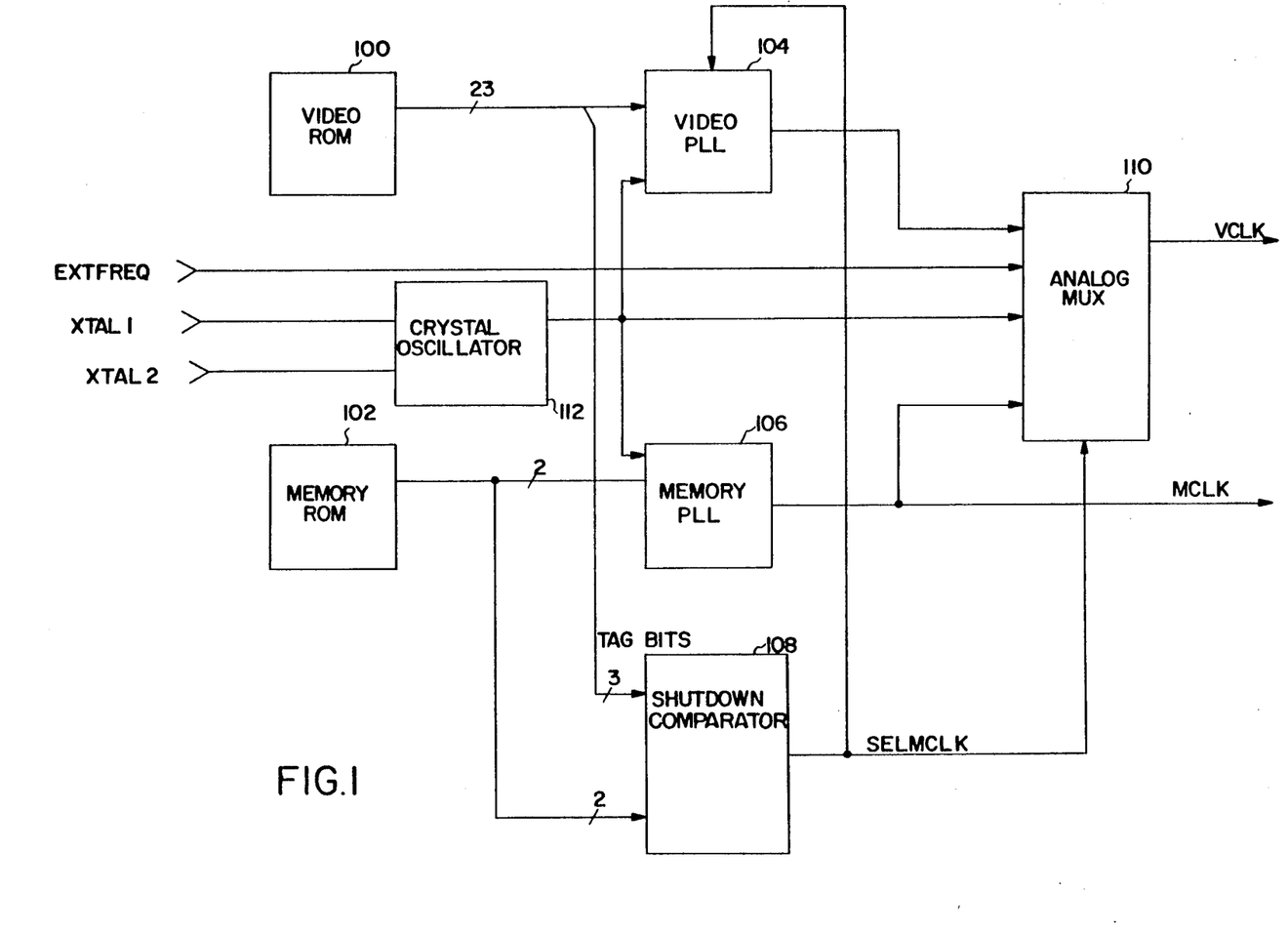
FIG. 1 is a simplified functional block diagram of the dual dot clock signal generator integrated circuit.

FIG. 1 shows a simplified block diagram of an exemplary dual dot clock signal generator integrated circuit. The dual dot clock signal generator produces two separate high-speed clock signals, VCLK (Video Clock) and MCLK (Memory Clock). This circuit may include the following components: a single crystal oscillator 112; Video Read-Only-Memory (ROM) 100 and Memory ROM 102 for programming the desired frequencies of the two output clock signals, MCLK and VCLK; a Video phase-locked-loop (PLL) 104 and a Memory phase-locked-loop 106 for generating the clock signals; a shutdown comparator 108 for sensing when two potentially conflicting frequencies are selected; and an analog multiplexer 110 which passes either the user-selected clock signal generated internally, or an externally generated clock signal, to the VCLK output terminal. The MCLK output signal is taken directly from the Memory PLL 108.

Each of the two clock signal generators is separately programmed using values stored in its ROM to produce signals which may range in frequency from approximately 5 MHz to 120 MHz. When the two clock signal generators are programmed to produce potentially conflicting clock signal frequencies, the shutdown comparator 108 senses this condition, and acts to change the frequency of the video clock signal generator. Under this condition, the comparator also ensures that the signal MCLK is passed through the analog multiplexer to the output terminal VCLK, in place of the internally generated video clock signal.

In the exemplary embodiment of the invention, the video clock signal undergoes the change in frequency, while the memory clock signal remains unchanged. In its intended application, the memory clock signal is supplied to drive the control and/or processing logic in a high performance graphic display system, while the video clock signal is used to provide pixels to a display. This type of application for the dual dot clock signal generator generally requires a greater range of frequencies for the video clock signal than for the memory clock signal, to meet a number of different graphics standards. Therefore, in the embodiment of the invention discussed here, the video ROM 100 contains more frequency codes than the memory ROM 102. It is contemplated that an equal number of clock signal frequency selections can be made available for both clock signals by increasing the number of values held by the memory ROM.

DETAILED DESCRIPTION

Figure 2:
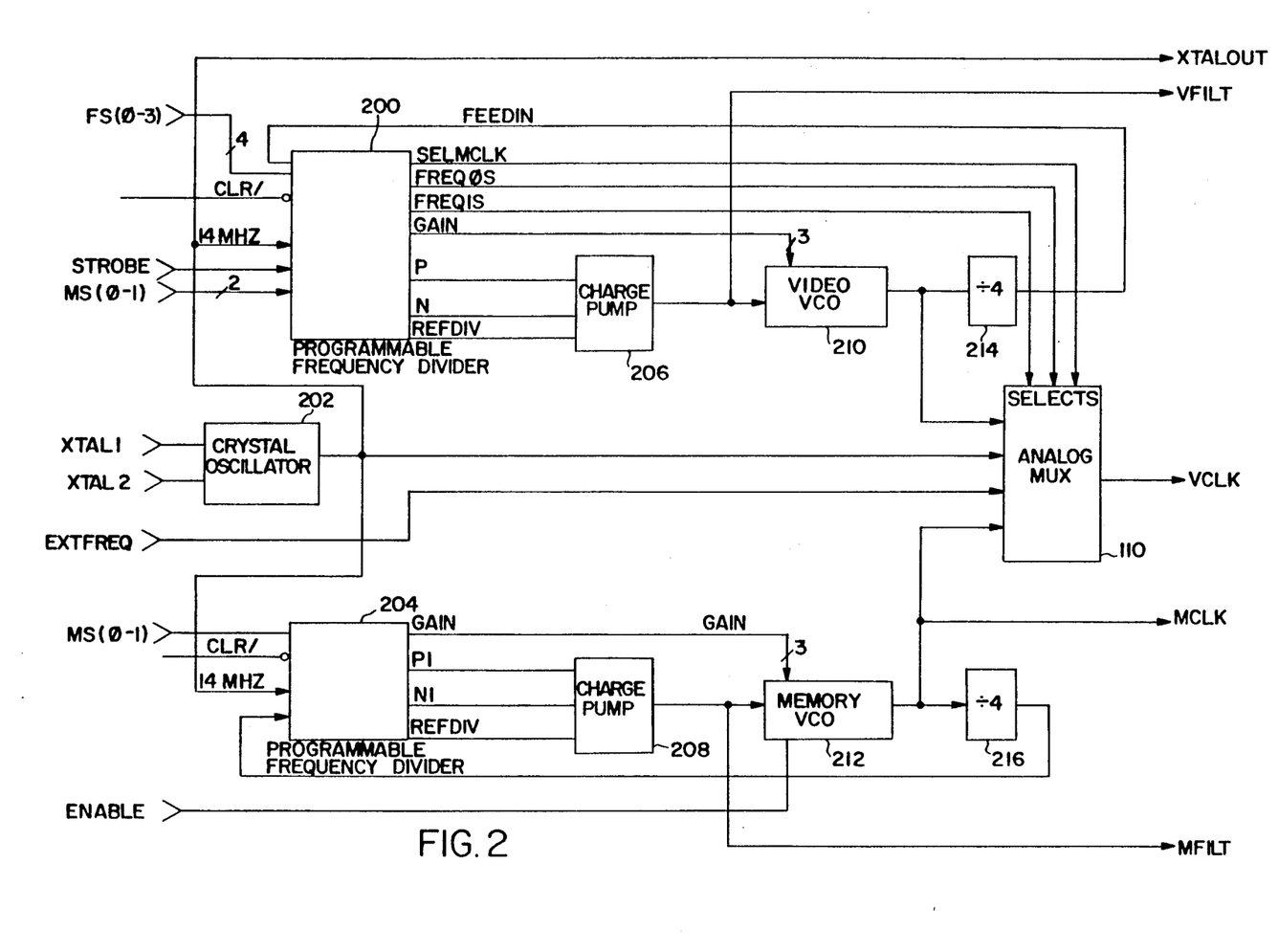
FIG. 2 is a block diagram showing details of the dual dot clock signal generator of FIG. 1.

As shown in FIG. 2, the dual dot clock signal generator consists primarily of two programmable clock signal generator circuits. As set forth above, the video clock signal generator is followed by a multiplexer which allows either the selected video clock signal, the memory clock signal, an external clock signal, or the reference clock signal to pass through to the video clock output terminal VCLK.

The video phase-locked loop (PLL) circuit consists of the following components: a programmable frequency divider module 200, a charge pump 206, a VCO 210, and a divide-by-four prescaler 214. Contained within the module 200 are two programmable counters, a ROM which holds data for programming the counters and setting the gain of the VCO, input latches for ROM addresses, a phase detector, a programmable divide-by-two prescaler, and a shutdown comparator (to be discussed later).

The PLL circuit for the memory clock signal generator consists of a programmable frequency divider module 204, a charge pump 208, a VCO 212, and a divide-by-four prescaler 216. The module 204 includes two programmable counters, a ROM which holds data for programming the counters and setting the gain of the VCO, input latches for ROM addresses, a phase detector, and a programmable divide-by-two prescaler. These components of the memory clock signal generator, the charge pump 208, VCO 212, and divide-by-four prescaler 216, are identical to their corresponding components in the video clock signal generating circuit: charge pump 206, VCO 210, and prescaler 214. The modules 200 and 204 are nearly identical. The frequency divider module 204 contains a smaller ROM than the module 200 and has no shutdown comparator and associated gating circuits. These components are discussed below in reference to FIG. 3.

In FIG. 2 a reference frequency crystal is coupled to the resonant crystal controlled oscillator 202 via the input terminals XTAL1 and XTAL2. A series resonant crystal of frequency 10 MHz to 25 MHz may be used, however, a crystal having a resonant frequency of with 14.31818 MHz is typical for IBM-compatible applications. Alternatively, a high quality bus signal, such as the 14 MHz motherboard clock signal in many IBM compatible computers, may be coupled to XTAL1 input line while the input line XTAL2 is left open. This configuration may be used in an application where the graphics subsystem is resident on a motherboard, thus saving the cost of an additional crystal. In motherboard applications it may be desirable to have the dual dot clock signal generator provide the bus clock signal for the rest of the system. In this case, the output terminal XTALOUT is buffered by a CMOS driver.

The oscillatory output signal of the crystal oscillator 202 is applied to a reference input divider (not shown) contained within the module 200. Similarly, in the circuit which generates the memory clock signal, the output signal of the oscillator 202 is applied to a reference input divider (not shown) within the module 204.

The reference input divider in each of the exemplary clock signal generators is a programmable 7-bit down counter which counts down from a preset value to zero. The counter decrements its count value by one for each input pulse it receives from the output terminal of crystal oscillator 202. When the count reaches zero, a pulse appears at the output terminal of the counter, and the preset count value is reloaded. Thus, the frequency of the output clock signal equals frequency of the input clock signal divided by the value programmed into the counter plus one. The extra count occurs because counter decrements from N to zero in N+1 count intervals. Within each of the modules 200 and 204, the preset input terminals of the reference divider are coupled to the video ROM 100 and memory ROM 102, respectively.

In both the video PLL and the memory PLL, the frequency divided input signal is compared with the output signal of a VCO fed back through a programmable pre-scaler and a divider. The frequency of the output signal of the VCO is first scaled by four, then selectively scaled by two, and then divided by a 7-bit down counter in the same way that the input signal is divided in frequency. The reference frequency is compared with the frequency divided feedback frequency by a phase detector contained within the module 200 or 204. Any change in the frequency or phase of the VCO forces the output signal of the feedback divider to shift in frequency or phase relative to the reference signal. The phase comparator senses any phase differences between its input signals and produces output signals P and N which are proportional to the difference between the input frequencies. P and N are provided to a charge pump and an integrating loop filter (typically a resistor-capacitor circuit which the user supplies externally to the dual dot clock signal generator). The loop filter integrates the error pulse and provides a correction signal back to the VCO. The correction signal changes the frequency of the output signal of the VCO to eliminate the error, thus keeping the loop locked. The frequency of the final clock signal, produced when the loop is locked, is substantially equal to the reference frequency multiplied by the feedback divider ratio multiplied by 4 or 8 and then divided by the reference input divider ratio.

Figure 3:
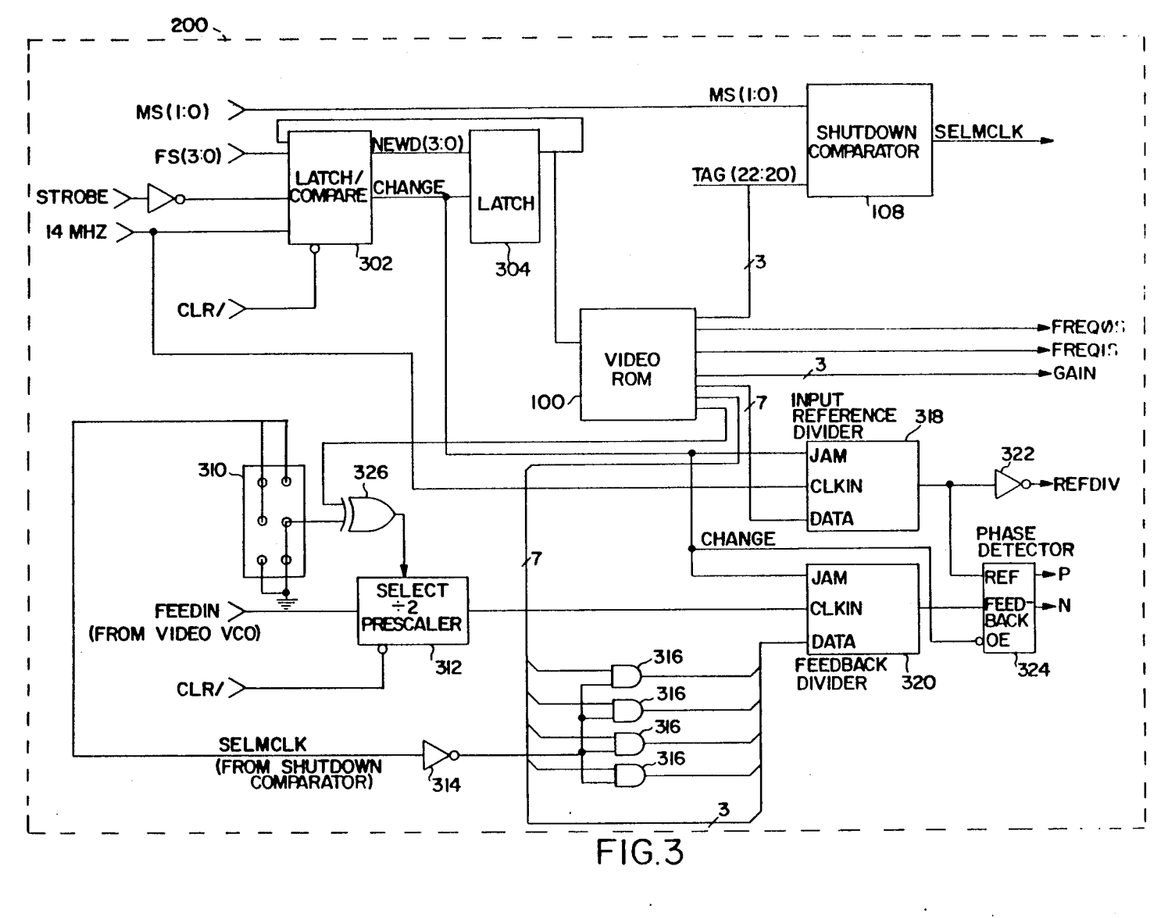
FIG. 3 is a block diagram of a programmable frequency divider module of the portion of the dual dot clock generator of FIG. 2 which generates the video clock signal.

FIG. 3 shows the internal components of the frequency divider module 200. The video latch/comparator 302 and input latch 304 act together to capture new frequency select data FS(3:0). Four bits of frequency select data are provided to latch/comparator 302 on the FS input lines, accompanied by an active high STROBE signal. The STROBE signal is inverted, and applied to latch/comparator 302. Previous frequency select data bits are compared with the current frequency select data bits. If the new data is found to be different, a CHANGE pulse is provided by the latch/comparator 302. The CHANGE signal is formed using the 14 MHz input signal to latch/comparator 302. CHANGE is held active for 16 clock cycles in order to allow the counters (discussed below) enough time to clear before new frequency division values are loaded from the ROM 100. The CHANGE pulse causes new frequency select data bits to be captured by latch 304. The output signal of latch 304 is fed back to latch/comparator 302, so that current frequency select data may be used for future comparisons. The 4-bit frequency select output signal of latch 304 is applied to the address input terminals of ROM 100.

Video ROM 100 stores values to set the gain of the VCO 210 and to select the frequency of the video clock signal. In the exemplary embodiment of the invention, ROM 100 has 16 locations, each storing 23 bits of data. It is contemplated that a ROM having a larger number of addressable locations would allow even greater frequency resolution for this clock signal. It is contemplated that an EEPROM or RAM could be used instead of a mask-programmable ROM. This substitution would give the user the capability to configure the video memory on-site or dynamically under software control.

The 23 data bits stored within the video ROM 100 in this embodiment are allocated in the following way:

| BITS(0-6) | 7 bits | VCO frequency divider |
|---|---|---|
| BITS(7-13) | 7 bits | reference input divider |
| BITS(14-15) | 2 bits | external frequency selects |
| BIT(16) | 1 bit | divide-by-two control |
| BITS(17-19) | 3 bits | VCO gain setting |
| BITS(20-22) | 3 bits | tag bits |

The preset input terminals of frequency dividers (counters) 318 and 320 are coupled to the data output lines of ROM 100. When the frequency select bits from latch 304 are applied to ROM 100, the ROM provides the corresponding preset count values to counters 318 and 320.

Reference input divider 318 is clocked by the reference frequency signal provided by the crystal oscillator 202 shown on FIG. 2. The signal name given to the reference frequency in this diagram is 14 MHZ, indicating that a 14.31818 MHz resonant crystal is used in the exemplary embodiment. This crystal frequency is commonly used in IBM-compatible video graphics applications. Actual crystals successfully tested in this circuit range from 10 MHz to 25 MHz. As set forth above, the reference input divider 318 supplies an output signal having a frequency which is equal to the frequency of the input clock signal divided by the value loaded into the counter's preset input value plus one. This output signal is then supplied to the reference input terminal of phase comparator 324.

Feedback divider 320 supplies the feedback input signal to phase comparator 324. This divider 320 is implemented as a 7-bit down counter, identical to the reference input divider 318 discussed above. The output signal of feedback divider 320 is derived in the following manner: The video VCO 210 shown in FIG. 2 supplies an oscillatory signal FEEDIN to the divide-by-two prescaler 312. BIT 16 of the value provided by the video ROM 100, described above, is applied to the Select input terminal of the prescaler. When BIT 16 is low, the signal FEEDIN is passed directly through prescaler 312. When BIT 16 is high, the signal FEEDIN is divided by two. BIT 16 is gated by an exclusive-OR gate 326 with one of two signals. The selection of signals is made by metal mask option. In the embodiment shown in FIG. 3, the gate input terminal is tied to ground, effectively passing BIT 16 through the gate 326. Optionally, BIT 16 may be gated with SELMCLK instead. If the second option is chosen, then when SELMCLK is active (high), BIT 16 is inverted. The metal mask option is available to the implementer of the integrated circuit so that he may decide how to gate BIT 16 based on the frequency selections available in ROM. The prescaler 312 is also responsive to an active low signal, CLR, which clears the prescaler upon power up. The signal thus produced by selectable prescaler 312 is applied to the clock input terminal of feedback divider 320.

The preset input terminals to feedback divider 320 are coupled to data output lines BITS (0-6) of the video ROM 100 as set forth above. ROM 100 applies BIT 0 through BIT 2 directly to the preset input terminals of the respective counters 318 and 320, while gating the lines BIT 3 through BIT 6 by respective AND gates 316. The value thus loaded to the preset input terminal of the counter 320 depends upon the state of the signal SELMCLK, discussed below.

The feedback divider 320 decrements one from the preset value for each clock pulse it receives. When the count reaches 0, a pulse is produced. Thus the frequency of the output signal from the counter is equal to the frequency of the input clock signal divided by the value (plus one) applied to the preset input ports.

The feedback divider output signal and the reference input divider output signal are compared by phase comparator 324. As set forth above, any change in frequency of the VCO forces the output signal of the feedback divider to shift in phase relative to the reference signal. The phase comparator senses any phase differences between its reference and feedback input signals and produces two signals, P and N, which are proportional to the amount of the frequency error.

P and N are supplied to a charge pump 206, which acts as a current source when P is active and as a current sink when N is active. The output signal of the charge pump 206 is brought to an output pin so that a loop filter (not shown) may be implemented. The loop filter may be an active or passive integrating filter, which conditions the phase difference signal provided by the charge pump 206 to produce a correction voltage for the VCO. Loop filters are well known in the art and thus need not be described herein.

A valid change in the frequency select bits FS(3:0), accompanied by an active high STROBE signal causes the CHANGE output signal of latch/comparator 302 to pulse high. Phase comparator 324 is responsive to the control signal CHANGE, as are reference input divider 318 and feedback divider 320. CHANGE is coupled to the JAM input terminals of dividers 318 and 320. When CHANGE is active, the output signal of each divider is forced low and the output signals P and N of the phase detector 324 are placed in a high impedance state. Thus, no correction voltage is applied to the VCO for a brief period of time in which new frequency data is loaded to the counters. During this time interval the VCO will experience little or no change in frequency. This mode of operation allows a shorter response time for the VCO to adjust up or down to the new selected frequency.

Shutdown comparator 108 compares the selected memory frequency indicated by MS(1:0) with tag bits that accompany each video frequency selection in ROM 100. Three tag bits are assigned to each frequency in ROM 100:

TAG22 high indicates this video frequency is same as or very close in value to a memory frequency.

TAG21, TAG20: when TAG22 is high, (TAG21, TAG20) is a binary value indicating one of the four possible memory frequencies with which this video frequency may conflict.

The output signal of shutdown comparator 108 is the active high signal SELMCLK (SELect Memory CLocK). In this embodiment of the invention, SELMCLK is true when the selected memory frequency is equal to the selected video frequency.

In the exemplary embodiment, four of the preset input signals to counter 320 (VCO feedback divider) are each gated by AND gates 316 with the inverted version of the signal SELMCLK. When SELMCLK is high, these four counter input terminals are forced low. The effect of forcing the counter input terminals low is to load a lower number into the video VCO feedback divider. This causes the video VCO 210 to produce a higher frequency output signal, thus eliminating the interference with the VCO 212 in the memory PLL. By not shutting down the conflicting video VCO, and instead, operating it at a higher frequency, less time is required to adjust up or down to a new frequency when the selected video frequency is changed.

When SELMCLK is high, it also causes a change in the output signal provided by the multiplexer 110. Multiplexer 110 routes one of its input signals to the signal line VCLK depending on which select signal is active. Only one of the three select signals, SELMCLK, FREQ1S, or FREQ0S may be active at one time. When none of the select signals are active, the video clock signal produced in the video PLL circuit 104 is automatically selected as the output clock signal. When FREQ0S is active, the external frequency signal EXTFREQ is placed on the VCLK output terminal. When FREQ1S is active, the reference clock signal 14 MHZ is placed on the VCLK output terminal by multiplexer 110.

When SELMCLK is active, the multiplexer 110 places the signal produced by the memory phase-locked loop 106 on its output lines as set forth above. Thus, in effect, the dual dot clock signal generator becomes a single dot clock signal generator supplying the same frequency to two different output lines. It is contemplated that an alternative configuration for the dual dot clock signal generator would yield the same functionality. That is, it is contemplated that the multiplexer 110 could be placed in the path of the memory clock signal generating circuit. In this configuration, when two nearly identical frequencies are chosen for the video clock signal and the memory clock signal, the frequency of the memory clock oscillator is changed, and the video clock signal is substituted for the memory clock signal.

Figure 4:
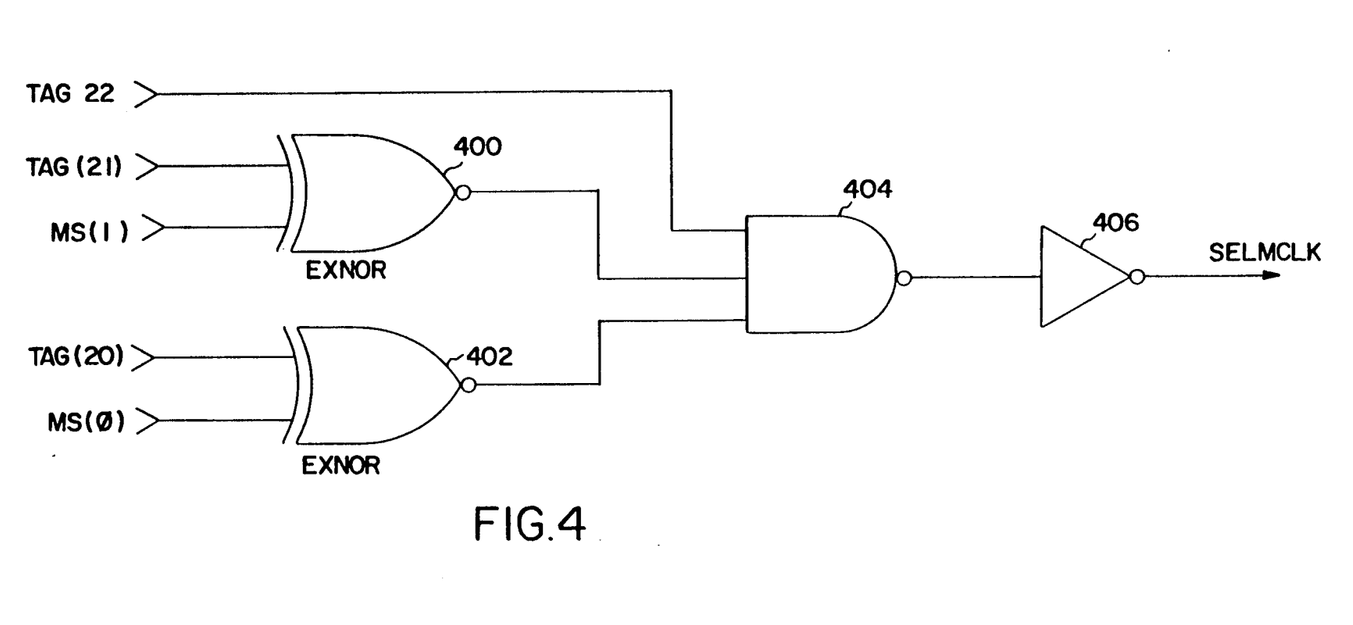
FIG. 4 is a logic schematic diagram of a shutdown comparator suitable for use in the dual dot clock signal generator of FIG. 2.

FIG. 4 shows an exemplary shutdown comparator circuit suitable for use with the dual dot clock signal generator. The two frequency select data bits MS(0) and MS(1) corresponding to the memory clock signal are compared with TAG(20) and TAG(21) from the video frequency select ROM. TAG(21) and TAG(20) together correspond to the ROM address of those memory clock signal frequencies which are approximately equal to the video clock frequencies associated with each set of tag bits. For example, if at some location in the video ROM 308 TAG(22) is true and (TAG(21) TAG(20)) is equal to (00), this indicates that the memory ROM address (00) contains information to generate a memory clock signal with a frequency approximately equal to the frequency of the video clock signal.

Exclusive-NOR gates 400 and 402 produce active high output signals when these bits are equal. The exclusive-NOR gate output signals are combined in NAND gate 404 with TAG(22). If TAG(22) is true, and if the tag bits indicate that the selected video clock frequency is approximately equal to the selected memory clock frequency, then a low signal results at the output terminal of NAND gate 404. This signal is inverted by an inverter 406 to produce the signal SELMCLK, an active high signal.

Figure 5:
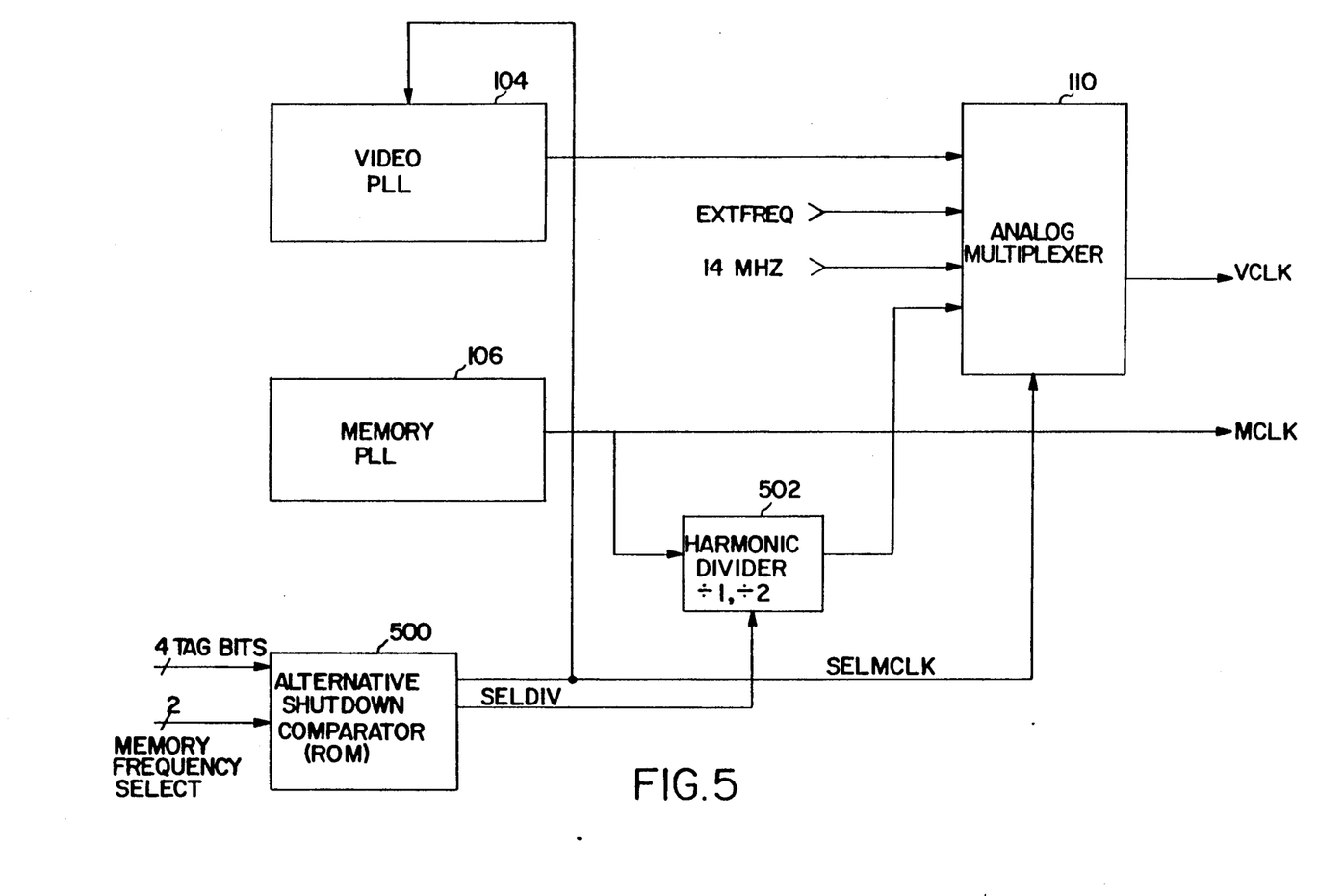
FIG. 5 is a block diagram of the dual dot clock signal generator of FIG. 1 with an alternative shutdown circuit and clock signal frequency divider for use in detecting selected memory frequencies which are harmonically related to selected video frequencies.

The shutdown comparator of FIG. 4 is designed to handle the case where the frequencies of the video and memory clock signals are approximately equal. FIG. 5 shows an alternative arrangement for the dual dot clock signal generator, whereby memory frequencies which are approximately harmonically related to the selected video frequencies may be re-routed to the video clock output terminal. An alternative shutdown comparator 500, which may be implemented by a 64 location ROM, has two output signals, SELMCLK and SELDIV (SELect divider). The alternative shutdown ROM 500 uses an extra tag bit from the video ROM 100, which indicates that a particular video frequency selection is a sub-harmonic of one of the memory frequency selections. The tables below illustrate an exemplary arrangement of tag bits for identifying same and harmonic frequencies for a given set of memory and video clock signal frequencies:

| MS (1) | MS (0) | Mem Clk Freq |
|---|---|---|
| 0 | 0 | 10 MHz |
| 0 | 1 | 20 MHz |
| 1 | 0 | 30 MHz |
| 1 | 1 | 40 MHz |

| Vid Clk Freq | TAG23 | TAG22 | TAG21 | TAG20 |
|---|---|---|---|---|
| 10 MHz | 1 | 1 | 0 | 0 |
| 15 MHz | 1 | 0 | 1 | 0 |
| 22 MHz | 0 | 0 | 0 | 0 |
| 40 MHz | 0 | 1 | 1 | 1 |

TAG(23) is set high to identify those video frequencies which are sub-multiples of the available memory clock frequencies. TAG(22) is set high to identify those video frequencies which are identical (or close) to the available memory clock frequencies. TAG(21) and TAG(20) point to the memory frequency which is the same as or a harmonic of the corresponding video frequency. In this example the assumption is made that a video clock frequency which is one-half that of a selected memory clock frequency causes interference between the video PLL 104 and memory PLL 106. In this instance, the shutdown ROM 500 acts to pass either the memory clock signal or the divided memory clock signal to the multiplexer 110. The following table shows the different possibilities:

| TAG(23) | TAG(22) | |
|---|---|---|
| 0 | 0 | Video freq. will not interfere |
| 0 | 1 | Video freq. is same as a mem. freq |
| 1 | 0 | Video freq. is half of a mem. freq. |
| 1 | 1 | Video is half of one mem. freq and same as a second mem. freq. |

CASE 0: SELMCLK low SELDIV low.
Video clock signal generator output signal is passed to VCLK.

CASE 1: if MS(1,0)=TAG(21,20), SELMCLK is high and SELDIV is low. The frequency of the video VCO is changed; MCLK is routed to the VCLK output terminal.

CASE 2: if MS(1,0)=TAG(21,20), SELMCLK is high, and SELDIV is high. The video frequency is one-half of the memory frequency. Change the frequency of the video VCO; divide the signal MCLK by two and route it to the VCLK output terminal.

CASE 3: 3 subcases:
a) if MS(1,0)=TAG(21,20), SELMCLK is high and SELDIV is low. The video frequency is approximately equal to the memory frequency. Change the frequency of the video VCO; route the signal MCLK to the VCLK output terminal.
b) if MS(1,0) indicates a harmonic frequency, SELDIV is high and SELMCLK is high. The video frequency is one-half of the memory frequency. Change the frequency of the video VCO; divide the signal MCLK by two and route it to the VCLK output terminal.
c) for the other two values of MS(1,0), SELMCLK is low and SELDIV is low. The output signal of the video VCO does not interfere with the memory VCO. Pass each VCO output signal with its frequency unchanged to its respective output terminal.

While the invention has been described in terms of two exemplary embodiments, it is contemplated that it may be practiced as outlined above with modifications within the spirit and scope of the appended claims.

The Invention claimed is:

1. Apparatus, on a single integrated circuit, for use in generating two programmable clock signals, comprising:
first and second programmable clock signal generating means for generating respective first and second clock signals;
means for detecting potential interference between said first and second programmable clock signal generating means;
means, coupled to said first programmable clock signal generating means for changing the frequency of the signal provided thereby when said detecting means detects said potential interference;

means coupled to said second clock signal generator for generating from said second clock signal a substitute signal; for said first clock signal when said detecting means detects said potential interference.

2. The apparatus set forth in claim 1, wherein: said first programmable clock generator includes a programmable counter; and the means for changing the frequency of the signal provided by the first programmable clock signal generator further comprises:

memory means for providing a selected ratio value to said programmable counter;

gating means, coupled to said programmable counter and responsive to a control signal, for changing the ratio value provided to said programmable counter by said memory means;

control means for generating said control signal to change the ratio value provided to said programmable counter, when said detecting means detects said potential interference.

3. The apparatus set forth in claim 2, wherein:

the memory means provide a tag value appended to each ratio value, said tag values indicating that the selection of the respective ratio values may cause said interference between the first and second clock signal generating means;

said second programmable clock signal generator includes a further programmable counter; and the means for detecting a potential interference between the first and second programmable clock signal generating means further comprises:

further memory means for providing a further selected ratio value to the further programmable counter of said second programmable clock signal generating means; and comparator means, for comparing said tag bits of the selected ratio value to data representing the further selected ratio value to detect said potential interference.

4. The apparatus set forth in claim 3, wherein:

said/comparator means detects a potential conflict when the selected ratio value and the further selected ratio value condition said respective first and second clock signal generating means to produce respective first and second clock signals having approximately equal frequencies; and said means for generating a substitute signal includes means for substituting said second clock signal for said first clock signal when said detecting means detects said potential interference.

5. The apparatus set forth in claim 3, wherein said comparator means detects a potential conflict when the selected ratio value and the further selected ratio value condition said respective first and second clock signal generating means to produce respective first and second clock signals having frequencies which are approximately harmonically related; and said means for generating a substitute signal includes means for generating a frequency divided version of said second clock signal as the substitute signal for said first clock signal when said detecting means detects said potential interference.

6. In apparatus including, on a single integrated circuit, first and second clock signal generators for use in generating respective first and second programmable clock signals, each of said first and second clock signal generators including a memory, a method for preventing the generation of two conflicting clock signals, said method comprising the steps of:

storing frequency information for each of said first and second programmable clock signal generators in the respective memories of said first and second clock signal generators, such that the frequency information stored in each location within each of said memories contains sufficient information to produce a separate, desired frequency signal when selected for use by the respective programmable clock signal generator;

appending tag bits to said frequency information contained within the memory of said first clock signal generator, said tag bits marking locations within the memory which contain frequency information that, if selected, may cause said first clock signal generator to interfere with said second clock signal generator;

selecting, from the respective memories, frequency information for use by said first and second clock signal generators;

comparing the tag bits of the frequency information selected for said first clock signal generator to signals used to select the frequency information for said second clock signal generator to detect a conflict between said first and second clock signal generators; and, replacing said first clock signal with a signal derived from said second clock signal in response to the detection of a conflict between said first and second clock signal generators.

7. The method of claim 6, wherein the first clock signal generator includes a programmable frequency divider and the frequency information stored in the memory includes a ratio value for each respective programmable frequency value, and wherein the step of replacing the first clock signal with a signal derived from the second clock signal further comprises the steps of:

providing the ratio value from said selected frequency information to the programmable frequency divider of the first programmable clock signal generator; and modifying said ratio value, responsive to the detection of a conflict between said first and second clock signal generators, before the ratio value is provided to the programmable frequency divider of the first programmable clock signal generator to change the frequency of the signal produced by said first programmable clock signal generator.

8. Appartaus for use in generating two clock signals on a single integrated circuit, such that cross-interference between the two clock signals substantially eliminated, said apparatus comprising:

first and second programmable clock signal generating means, for producing said respective first and second clock signals, each of said clock signal generating means producing one output clock signal at a selected one of a plurality of frequencies;

comparison means, coupled to the first clock signal generator, for generating a conflict signal when the selected frequency of one said clock signals is approximately harmonically related to the selected frequency of the other one of said clock signals;

means, coupled to said second clock signal generator for generating a third clock signal which is harmonically related to said second clock signal; and control means, coupled to the first clock signal generator, for changing the frequency of the signal produced by the first clock signal generator and for substituting said third clock signal in place of the first clock signal in response to said conflict signal.

9. Apparatus for use in generating two clock signals on a single integrated circuit, such that cross-interference between the two clock signals is substantially eliminated, said apparatus comprising:

first and second programmable clock signal generating means, for producing said respective first and second clock signals, each of said clock signal generating means producing one output clock signal at a selected one of a plurality of frequencies;

comparison means, coupled to the first clock signal generator, for generating a conflict signal when the selected frequency of one of said clock signals is approximately equal to the selected frequency of the other one of said clock signals;

control means, coupled to the first clock signal generator, for changing the frequency of the signal produced by the first clock signal generator and for substituting the second clock signal in place of the first clock signal in response to said conflict signal.

* * * * *